United States Patent
Xiao et al.

(10) Patent No.: US 11,735,413 B2
(45) Date of Patent: *Aug. 22, 2023

(54) PRECURSORS AND FLOWABLE CVD METHODS FOR MAKING LOW-K FILMS TO FILL SURFACE FEATURES

(71) Applicant: VERSUM MATERIALS US, LLC, Tempe, AZ (US)

(72) Inventors: Manchao Xiao, San Diego, CA (US); Daniel P. Spence, Carlsbad, CA (US); Richard Ho, Anaheim, CA (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/789,732

(22) Filed: Oct. 20, 2017

(65) Prior Publication Data

US 2018/0122631 A1    May 3, 2018

Related U.S. Application Data

(60) Provisional application No. 62/415,756, filed on Nov. 1, 2016.

(51) Int. Cl.
*H01L 21/00* (2006.01)
*H01L 21/02* (2006.01)
(Continued)

(52) U.S. Cl.
CPC ...... *H01L 21/02211* (2013.01); *C09D 183/16* (2013.01); *C23C 16/045* (2013.01);
(Continued)

(58) Field of Classification Search
CPC ........................................... H01L 21/00
See application file for complete search history.

(56) References Cited

U.S. PATENT DOCUMENTS

| 7,074,690 B1 | 7/2006 | Gauri et al. |
| 7,498,273 B2 | 3/2009 | Mallick et al. |

(Continued)

FOREIGN PATENT DOCUMENTS

EP    1724373 A1    11/2006

OTHER PUBLICATIONS

Su, Dong, et al., "Synthesis and Characterization of Ethylene-Bridged Copolycarbosilazane as Precursors for Silicon Carbonitride Ceramics", J. Am Ceram. Soc., vol. 97, No. 4, 2014, pp. 1311-1316.
(Continued)

*Primary Examiner* — Gordon Baldwin
*Assistant Examiner* — Mohammad Mayy
(74) *Attorney, Agent, or Firm* — Daniel A. DeMarah, Jr.

(57) ABSTRACT

A method for depositing a silicon-containing film, the method comprising: placing a substrate comprising at least one surface feature into a flowable CVD reactor; introducing into the reactor at least one silicon-containing compound and at least one multifunctional organoamine compound to at least partially react the at least one silicon-containing compound to form a flowable liquid oligomer wherein the flowable liquid oligomer forms a silicon oxide coating on the substrate and at least partially fills at least a portion of the at least one surface feature. Once cured, the silicon carbonitride coating has excellent mechanical properties.

24 Claims, 3 Drawing Sheets

(51) Int. Cl.

| | |
|---|---|
| *C23C 16/56* | (2006.01) |
| *C23C 16/36* | (2006.01) |
| *C23C 16/04* | (2006.01) |
| *C09D 183/16* | (2006.01) |
| *C23C 16/24* | (2006.01) |
| *C23C 16/32* | (2006.01) |
| *C23C 16/34* | (2006.01) |
| *C23C 16/48* | (2006.01) |
| *C23C 16/50* | (2006.01) |
| C08G 77/62 | (2006.01) |
| H01L 21/762 | (2006.01) |

(52) U.S. Cl.
CPC ............ *C23C 16/24* (2013.01); *C23C 16/325* (2013.01); *C23C 16/345* (2013.01); *C23C 16/36* (2013.01); *C23C 16/48* (2013.01); *C23C 16/50* (2013.01); *C23C 16/56* (2013.01); *H01L 21/0217* (2013.01); *H01L 21/0234* (2013.01); *H01L 21/02167* (2013.01); *H01L 21/02219* (2013.01); *H01L 21/02271* (2013.01); *H01L 21/02274* (2013.01); *H01L 21/02348* (2013.01); *H01L 21/02351* (2013.01); C08G 77/62 (2013.01); H01L 21/76224 (2013.01)

(56) References Cited

U.S. PATENT DOCUMENTS

| | | | |
|---|---|---|---|
| 7,521,378 B2 | 4/2009 | Fucsko et al. | |
| 7,541,297 B2 | 6/2009 | Mallick et al. | |
| 7,557,420 B2 | 7/2009 | Fucsko et al. | |
| 7,582,555 B1 | 9/2009 | Lang et al. | |
| 7,825,040 B1 | 11/2010 | Fukazawa et al. | |
| 7,888,233 B1 | 2/2011 | Gauri et al. | |
| 7,915,131 B2 | 3/2011 | Nakagawa et al. | |
| 8,449,942 B2 | 5/2013 | Liang et al. | |
| 8,481,403 B1 | 7/2013 | Gauri et al. | |
| 8,575,040 B2 | 11/2013 | Fucsko et al. | |
| 8,580,697 B1 | 11/2013 | Lang et al. | |
| 8,629,067 B2 | 1/2014 | Liang et al. | |
| 8,685,867 B1 | 4/2014 | Danek et al. | |
| 8,741,788 B2 | 6/2014 | Liang et al. | |
| 2001/0000476 A1* | 4/2001 | Xia | C23C 16/345 427/255.27 |
| 2006/0178019 A1* | 8/2006 | Senzaki | C23C 16/308 438/788 |
| 2006/0216950 A1* | 9/2006 | Matsuura | C23C 16/345 438/775 |
| 2008/0207007 A1* | 8/2008 | Thridandam | C23C 16/401 438/778 |
| 2008/0242116 A1* | 10/2008 | Clark | C23C 16/345 438/791 |
| 2010/0062614 A1* | 3/2010 | Ma | C23C 16/34 438/785 |
| 2010/0190942 A1* | 7/2010 | Hosaka | C07F 7/10 526/128 |
| 2013/0230987 A1 | 9/2013 | Draeger et al. | |
| 2014/0073144 A1* | 3/2014 | Chatterjee | H01L 21/02274 438/793 |
| 2015/0056822 A1* | 2/2015 | Pearlstein | H01L 21/02282 106/287.11 |
| 2015/0087139 A1 | 3/2015 | O'Neill et al. | |
| 2015/0246937 A1 | 9/2015 | Xiao et al. | |
| 2015/0376211 A1* | 12/2015 | Girard | C23C 16/345 428/447 |
| 2016/0024647 A1 | 1/2016 | Saly et al. | |
| 2016/0099146 A1* | 4/2016 | Saly | H01L 21/02211 423/335 |
| 2016/0237100 A1* | 8/2016 | Spence | C07F 7/1804 |
| 2016/0276148 A1* | 9/2016 | Qian | C23C 16/02 |
| 2019/0035673 A1* | 1/2019 | Mays | H01L 21/02356 |

OTHER PUBLICATIONS

Hector, Andrew L., "Synthesis and processing of silicon nitride and related materials using preceramic polymer and non-oxide sol-gel approaches", Elsevier, Article in Press, Coordination Chemistry Reviews (2016), pp. 1-18.

\* cited by examiner

PRECURSORS AND FLOWABLE CVD METHODS FOR MAKING LOW-K FILMS TO FILL SURFACE FEATURES

CROSS-REFERENCE TO RELATED APPLICATIONS

This application claims priority under 35 U.S.C. § 119(e) to U.S. provisional patent application No. 62/415,756, filed on Nov. 1, 2016, the entirety of which is incorporated herein by reference.

BACKGROUND

Described herein is a process for the fabrication of an electronic device. More specifically, described herein are compositions for forming a silicon-containing and, in particular, a non-oxygen containing or substantially free of oxygen silicon-containing film, in a deposition process, such as, for example, a flowable chemical vapor deposition. Exemplary silicon-containing films that can be deposited using the compositions and methods described herein include silicon nitride and carbon-doped silicon nitride films (silicon carbonitride).

Flowable oxide deposition methods typically use alkoxysilane compounds as precursors for silicon-containing films which are deposited by controlled hydrolysis and condensation reactions. Such films can be deposited onto a substrate, for example, by applying a mixture of water and alkoxysilanes, optionally with solvent and/or other additives such as surfactants and porogens, onto a substrate. Typical methods for the application of these mixtures include spin coating, dip coating, spray coating, screen printing, co-condensation, and ink jet printing. After application to the substrate and upon application of one or more energy sources such as, for example, thermal, plasma, and/or other sources, the water within the mixture can react with the alkoxysilanes to hydrolyze the alkoxide and/or aryloxide groups and generate silanol species, which further condense with other hydrolyzed molecules and form an oligomeric or network structure.

Besides physical deposition or application of the precursor to the substrate, vapor deposition processes using water and a silicon containing vapor source for flowable dielectric deposition (FCVD) have been described, for instance, in U.S. Pat. Nos. 7,541,297; 8,449,942; 8,629,067; 8,741,788; 8,481,403; 8,580,697; 8,685,867; 7,498,273; 7,074,690; 7,582,555; 7,888,233, and 7,915,131, as well as U.S. Publ. No. 2013/0230987 A1, the disclosures of which are incorporated herein by reference. Typical methods generally relate to filling gaps on substrates with a solid dielectric material by forming a flowable liquid film in the gap. The flowable film is formed by reacting a dielectric precursor which may have a Si—C bond with an oxidant to form the dielectric material. In certain embodiments, the dielectric precursor condenses and subsequently reacts with the oxidant to form dielectric material. In certain embodiments, vapor phase reactants react to form a condensed flowable film. Since the Si—C bond is relatively inert towards reaction with water, the resultant network may be beneficially functionalized with organic functional groups which impart desired chemical and physical properties to the resultant film. For example, the addition of carbon to the network may lower the dielectric constant of the resultant film.

Another approach to depositing a silicon oxide film using flowable chemical vapor deposition process is gas phase polymerization. For example, the prior art has focused on using compounds such as trisilylamine (TSA) to deposit Si, H, N containing oligomers that are subsequently oxidized to SiOx films using ozone exposure. Examples of such approaches include: U.S. Publ. No. 2014/0073144; U. S. Publ. No. 2013/230987; U.S. Pat. Nos. 7,521,378, 7,557, 420, and 8,575,040; and 7,825,040, the disclosures of which are incorporated herein by reference.

Regarding the processes that employ trisilylamine (TSA), TSA is typically delivered into the reaction chamber as a gas, mixed with ammonia, and activated in a remote plasma reactor to generate $NH_2$, NH, H and or N radicals or ions. The TSA reacts with the plasma activated ammonia and begins to oligomerize to form higher molecular weight TSA dimers and trimers or other species which contain Si, N and H. The substrate is placed in the reactor and cooled to one or more temperatures ranging from about 0 to about 50° C. at a certain chamber pressures and TSA/activated ammonia mixtures the oligomers begin to condense on the wafers surface in such a way that they can "flow" to fill the trench surface feature. In this way, a material which contains Si, N and H is deposited onto the wafer and fills the trench. In certain embodiments, a pre-anneal step is performed to allow the film to be more SiN-like. It is desirable to have a SiN material because the next process step is oxidation at one or more temperatures ranging from 100-700° C. using ozone or water. Because of the SiN bond distance and angles, it is known that as SiN is oxidized to $SiO_2$ there is a unit cell volume increase which prevents the film from shrinking.

Despite the recent activity in the art related to flowable chemical vapor deposition and other film deposition processes, problems still remain. One of these problems is related to film composition. For example, flowable oxide films deposited from the precursor trisilylamine (TSA) in a gas phase polymerization process yield films with a high density of Si—H bonds and have a wet etch rates in dilute HF solutions that are 2.2 to 2.5 times faster than high quality thermal oxide. Such films are not suitable for low-k film applications.

In many circumstances, a hardening process, including thermal annealing, UV cure, or ion/radical densification, may be applied to the flowable films. The hardening process may remove carbon groups, hydroxyl groups and smaller molecular weight species from the deposited materials. Referring to FIG. 1, this often leaves voids, cracks or spaces in the hardened material. Such films are also not suitable for low-k film applications.

There is a need in the art to provide novel precursors or combinations of precursors that may allow for more effective control of the carbon content contained in the carbon-doped silicon containing film. Accordingly, there is a continuing need in the art to provide compositions of precursors for the flowable deposition of carbon-doped silicon-containing films which provide films that exhibit one or more of the following attributes: lower relative etch rates, greater hydrophobicity, higher deposition rates, higher density, compared to films deposited using the individual precursors alone.

SUMMARY

The compositions or formulations described herein and methods using same overcome the problems of the prior art by depositing a silicon-containing film on at least a portion of the substrate surface that provides desirable film properties upon post-deposition treatment.

In one aspect, the development described herein provides a method for depositing a silicon-containing film, the method comprising: placing a substrate comprising at least one surface feature into a reactor; introducing into the reactor at least one organoaminosilane compound having the structure of Formula I:

$(R^1R^2N)_{4-n}Si—R^3{}_n$         (I), wherein $R^1$, $R^2$ and $R^3$ are selected from the group consisting of hydrogen, $C_1$ to $C_{10}$ linear or branched alkyl, cyclic alkyl, alkenyl, alkynyl, and aryl; and n=0, 1, 2, 3, wherein at least one of $R^1$, $R^2$ and $R^3$ is not hydrogen; and at least one multifunctional organoamine compound having the structure of Formula II:

$NR^4R^5R^6$         (II), wherein $R^4$, $R^5$ and $R^6$ are each independently selected from the group consisting of H, a $C_1$-$C_4$ alkylmonoamino group, a $C_1$-$C_4$ alkyldiamino group, and a $C_1$-$C_4$ alkyltriamino group, wherein at least one of $R^4$, $R^5$ and $R^6$ is not hydrogen; and at least partially reacting the at least one organoaminosilane compound and the multifunctional organoamine compound, optionally in the presence of an energy source, to form a flowable liquid oligomer wherein the flowable liquid oligomer forms a coating on the substrate and at least partially fills at least a portion of the at least one surface feature.

In another aspect, the method of the present development further comprises the step of subjecting the coating to a thermal treatment at one or more temperatures between about 100° C. to about 1000° C. to densify at least a portion of the coating and form a hardened layer.

In still another aspect, the method of the present development further comprises the step of exposing the hardened layer to energy source selected from the group consisting of a plasma, infrared light, chemical treatment, an electron beam, or UV light to form the final silicon-containing film.

Other features and advantages of the present invention will be apparent from the following more detailed description of the preferred embodiment, taken in conjunction with the accompanying drawings which illustrate, by way of example, the principles of the invention. The embodiments and features of the present invention can be used alone or in combinations with each other.

BRIEF DESCRIPTION OF THE DRAWINGS

The present invention will hereinafter be described in conjunction with the appended figures wherein like numerals denote like elements.

DETAILED DESCRIPTION

Figure 1:
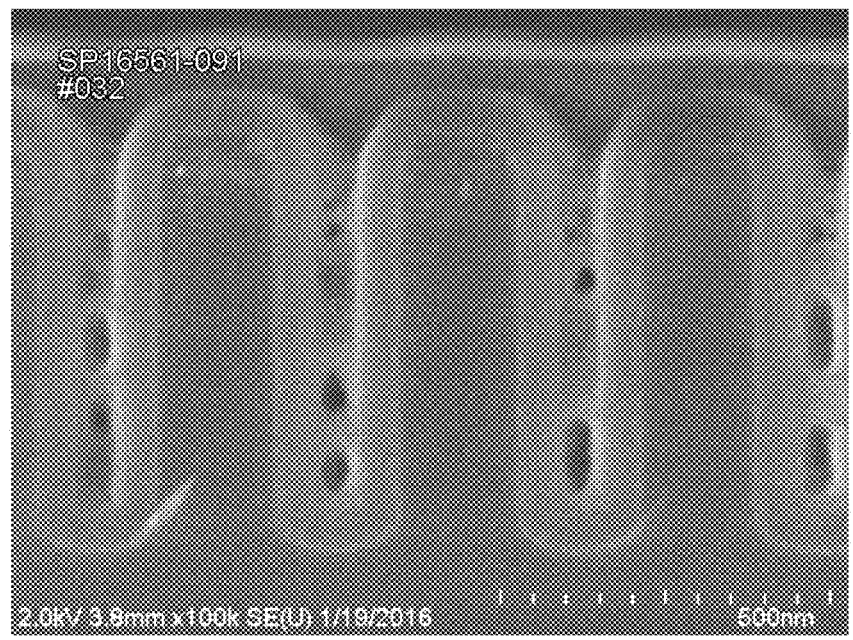
FIG. 1 is a SEM micrograph showing a silicon oxide film formed in trenches of a substrate wherein voids formed during the hardening process.

The ensuing detailed description provides preferred exemplary embodiments only, and is not intended to limit the scope, applicability, or configuration of the invention. Rather, the ensuing detailed description of the preferred exemplary embodiments will provide those skilled in the art with an enabling description for implementing the preferred exemplary embodiments of the invention. Various changes may be made in the function and arrangement of elements without departing from the spirit and scope of the invention, as set forth in the appended claims.

In the claims, letters may be used to identify claimed method steps (e.g. a, b, and c). These letters are used to aid in referring to the method steps and are not intended to indicate the order in which claimed steps are performed, unless and only to the extent that such order is specifically recited in the claims.

The compositions or formulations described herein and methods using same overcome the problems of the prior art by depositing a silicon-containing film on at least a portion of the substrate surface that provides desirable film properties upon post-deposition treatment.

The present invention is directed to semiconductor thin film process techniques. Methods and system are described for improving quality of the dielectric film morphologically adapted over various device structures. More particularly, embodiments of the invention provide methods and systems of forming silicon-containing film with increased density to achieve void free gap fill for trenches having a high aspect ratio. For example, the invention is applied to form high quality silicon-containing films for filling narrow STI trenches, among other applications.

Accordingly, in one aspect, the present development provides a method for depositing a silicon-containing film, the method comprising: placing a substrate comprising at least one surface feature into a reactor; introducing into the reactor at least one organoaminosilane compound having the structure of Formula I:

$(R^1R^2N)_{4-n}Si—R^3{}_n$         (I), wherein $R^1$, $R^2$ and $R^3$ are selected from the group consisting of hydrogen, $C_1$ to $C_{10}$ linear or branched alkyl, cyclic alkyl, alkenyl, alkynyl, and aryl; and n=0, 1, 2, 3, wherein at least one of $R^1$, $R^2$ and $R^3$ is not hydrogen; and at least one multifunctional organoamine compound having the structure of Formula II:

$NR^4R^5R^6$         (II), wherein $R^4$, $R^5$ and $R^6$ are each independently selected from the group consisting of H, a $C_1$-$C_4$ alkylmonoamino group, a $C_1$-$C_4$ alkyldiamino group, and a $C_1$-$C_4$ alkyltriamino group, wherein at least one of $R^4$, $R^5$ and $R^6$ is not hydrogen; and at least partially reacting the at least one organoaminosilane compound and the multifunctional organoamine compound, optionally in the presence of an energy source, to form a flowable liquid oligomer wherein the flowable liquid oligomer forms a coating on the substrate and at least partially fills at least a portion of the at least one surface feature.

The silicon-containing film is selected from the group consisting of a silicon nitride, a silicon carbide, and a carbon-doped silicon nitride. The compositions can be pre-mixed compositions, pre-mixtures (mixed before being used in the deposition process), or in-situ mixtures (mixed during the deposition process). Thus, in this disclosure the terms "mixture", "formulation," and "composition" are interchangeable.

In the formulas above and throughout the description, the term "alkyl" for $R^1$, $R^2$ and $R^3$ denotes a linear or branched functional group having from 1 to 10 or from 3 to 10 carbon atoms, respectively. Exemplary linear alkyl groups include, but are not limited to, methyl, ethyl, n-propyl, n-butyl, n-pentyl, and hexyl. Exemplary branched alkyl groups include, but are not limited to, isopropyl, isobutyl, sec-butyl, tert-butyl, iso-pentyl, tert-pentyl, isohexyl, and neohexyl. In certain embodiments, the alkyl group may have one or more functional groups such as, but not limited to, an alkoxy group, a dialkylamino group, an carbosilyl group, or combinations thereof, attached thereto. In other embodiments, the alkyl group does not have one or more functional groups attached thereto.

In the formulas above and throughout the description, the term "cyclic alkyl" denotes a cyclic functional group having from 3 to 10 or from 4 to 10 carbon atoms. Exemplary cyclic alkyl groups include, but are not limited to, cyclobutyl, cyclopentyl, cyclohexyl, and cyclooctyl groups.

In the formulas above and throughout the description, the term "aryl" denotes an aromatic cyclic functional group having from 5 to 10 carbon atoms. Exemplary aryl groups include, but are not limited to, phenyl, benzyl, chlorobenzyl, tolyl, and o-xylyl. In some embodiments, the aromatic cyclic group can have other elements such as oxygen, or nitrogen. Exemplary such groups include, but not limited to, pyrollyl, furanyl, pyridinyl, pyridazinyl.

In the formulas above and throughout the description, the term "alkenyl group" denotes a group which has one or more carbon-carbon double bonds and has from 2 to 10 or from 2 to 6 carbon atoms. Exemplary alkenyl groups include, but are not limited to, vinyl or allyl groups.

In the formulas above and throughout the description, the term "alkynyl group" denotes a group which has one or more carbon-carbon triple bonds and has from 2 to 10 or from 2 to 6 carbon atoms.

In the formulas above and throughout the description, the term "carbosilane" denotes an organosilane comprising carbon, hydrogen, and silicon having from 1 to 10 carbon atoms and from 1 to 10 silicon atoms, and which contains at least one Si—C bond. Examples of carbosilanes include, without limitation, methylsilane, ethylsilane, diethylsilane, dimethylsilane, triethylsilane, 1,2-dimethyldisilane, 1,4-disilabutane, 2-methyl-1,3-disilapropane, 1,3-disilapropane, 1-silacyclopentane, 1-methyl-1-silacyclopentane, 1-silacyclobutane, 1,3-disilacyclobutane, and phenylsilane.

In the formulas above and throughout the description, the term "carbosilyl" denotes an organosilyl group comprising carbon, hydrogen, and silicon having from 1 to 10 carbon atoms and from 1 to 10 silicon atoms, and which contains at least one Si—C bond. Examples of carbosilyl groups include, without limitation, methylsilyl (—SiMeH$_2$), ethylsilyl (—SiEtH$_2$), diethylsilyl (—SiEt$_2$H), dimethylsilyl (—SiMe$_2$H), triethylsilyl (—SiEt$_3$), trimethylsilyl (—SiMe$_3$), 1,2-dimethyldisilyl (—SiMeHSiMeH$_2$), 1,4-disilabutyl (—SiH$_2$CH$_2$CH$_2$SiH$_3$), dimethylvinylsilyl (—SiMe$_2$CH=CH$_2$), and phenylsilyl (—SiPhH$_2$).

In the formulas above and throughout the description, the term "silyl" denotes the unsubstituted silyl group (—SiH$_3$).

In formulas above and throughout the description, the term "organoamino" denotes a dialkylamino, alkylamino, or arylalkylamino group which may have from 1 to 10, or from 1 to 4 carbon atoms. Exemplary organoamino groups include, but are not limited to, dimethylamino (Me$_2$N—), diethylamino (Et$_2$N—), di-iso-propylamino ($^i$Pr$_2$N—), iso-propyl-sec-butylamino, N-sec-butyl-N-iso-propylamino, 1-(N-ethyl-N-cyclohexylamino, N-phenyl-N-iso-propylamino, tert-butylamino ($^t$BuNH—), tert-pentylamino ($^t$AmNH—), n-propylamino ($^n$PrNH—), and iso-propylamino ($^i$PrNH—).

In certain embodiments, one or more of the alkyl group or aryl groups in the formulae may be "substituted" or have one or more atoms or group of atoms substituted in place of, for example, a hydrogen atom. Exemplary substituents include, but are not limited to, oxygen, sulfur, halogen atoms (e.g., F, Cl, I, or Br), nitrogen, alkyl groups, and phosphorous. In other embodiments, one or more of the alkyl group, alkenyl group, alkynyl group, aromatic and/or aryl group in the formulae may be unsubstituted.

In the method of the present development, typically the first step is placing a substrate comprising at least one surface feature into a reactor. The substrate temperature can be, for example, from about −20° C. to about 400° C. In some embodiments, the substrate temperature is from about −20° C. to about 150° C. In other embodiments, the substrate temperature is from about 20° C. to about 100° C. In still other embodiments, the substrate temperature is from about 10° C. to about 150° C. In still other embodiments, the substrate temperature is from about −20° C. to about 100° C. In yet other embodiments, the substrate temperature is at room temperature (i.e., ambient temperature). Generally speaking, the substrate temperature will be based on achieving the desired behavior of the precursors employed. For example, if the substrate temperature is too high for a given set of reactants, the reactant products will gell and not properly flow to fill features on the substrate.

Suitable substrates include, but are not limited to, semiconductor materials such as gallium arsenide ("GaAs"), boronitride ("BN") silicon, and compositions containing silicon such as crystalline silicon, polysilicon, amorphous silicon, epitaxial silicon, silicon dioxide ("SiO$_2$"), silicon carbide ("SiC"), silicon oxycarbide ("SiOC"), silicon nitride ("SiN"), silicon carbonitride ("SiCN"), organosilicate glasses ("OSG"), organofluorosilicate glasses ("OFSG"), fluorosilicate glasses ("FSG"), and other appropriate substrates or mixtures thereof. Substrates may further comprise a variety of layers to which the film is applied thereto such as, for example, antireflective coatings, photoresists, organic polymers, porous organic and inorganic materials, metals such as copper and aluminum, or diffusion barrier layers, e.g., TiN, Ti(C)N, TaN, Ta(C)N, Ta, W, WN, TiSiN, TaSiN, SiCN, TiSiCN, TaSiCN, or W(C)N. The organosilicate glass films of the present invention are preferably capable of adhering to at least one of the foregoing materials sufficiently to pass a conventional pull test, such as an ASTM D3359-95a tape pull test.

In some embodiments, the substrate comprises a surface feature. The term "surface feature," as used herein, means that the substrate or partially fabricated substrate that comprises one or more of the following pores, trenches, shallow trench isolation (STI), vias, reentrant feature, or the like. In one particular embodiment, the surface feature(s) have a width of 100 μm or less, 1 μm in width or less, or 0.5 μm in width or less, or 50 nm in width or less. In this or other embodiments, the aspect ratio (the depth to width ratio) of the surface features, if present, is 0.1:1 or greater, or 1:1 or greater, or 10:1 or greater, or 20:1 or greater, or 40:1 or greater. The substrate may be a single crystal silicon wafer, a wafer of silicon carbide, a wafer of aluminum oxide (sapphire), a sheet of glass, a metallic foil, an organic polymer film or may be a polymeric, glass, silicon or metallic 3-dimensional article. The substrate may be coated with a variety of materials well known in the art including films of silicon oxide, silicon nitride, amorphous carbon, silicon oxycarbide, silicon oxynitride, silicon carbide, gallium arsenide, gallium nitride and the like. These coatings may completely coat the substrate, may be in multiple layers of various materials and may be partially etched to expose underlying layers of material. The surface may also have on it a photoresist material that has been exposed with a pattern and developed to partially coat the substrate.

The method used to form the films or coatings described herein are flowable chemical deposition processes. Examples of suitable deposition processes for the method disclosed herein include, but are not limited to, thermal chemical vapor deposition (CVD) or plasma enhanced cyclic CVD (PECCVD) process. An exemplary flowable CVD reactor is disclosed in U.S. Publ. No. 2014/0073144. As used herein, the term "flowable chemical vapor deposition processes" refers to any process wherein a substrate is exposed to one or more volatile precursors, which react and/or decompose on the substrate surface to provide flowable oligomeric silicon-containing species and then produce the solid film or material upon further treatment. Although the precursors, reagents and sources used herein may be sometimes described as "gaseous", it is understood that the precursors can be either liquid or solid which are transported with or without an inert gas into the reactor via direct vaporization, bubbling or sublimation. In some case, the vaporized precursors can pass through a plasma generator. In one embodiment, the films are deposited using a plasma-based (e.g., remote generated or in situ) CVD process. The term "reactor" as used herein, includes without limitation, a reaction chamber or deposition chamber.

In certain embodiments, the substrate may be exposed to one or more post-deposition treatments such as, but not limited to, a plasma treatment, thermal treatment, chemical treatment, ultraviolet light exposure, electron beam exposure, and combinations thereof to affect one or more properties of the films. These post-deposition treatments may occur under an atmosphere selected from inert, oxidizing, and/or reducing.

The method of the present development includes the step of introducing into the reactor at least one organoaminosilane compound having the structure of Formula I:

$$(R^1R^2N)_{4-n}Si—R^3{}_n \quad (I),$$

wherein $R^1$, $R^2$ and $R^3$ are selected from the group consisting of hydrogen, $C_1$ to $C_{10}$ linear or branched alkyl, cyclic alkyl, alkenyl, alkynyl, and aryl; and n=0, 1, 2, 3, wherein at least one of $R^1$, $R^2$ and $R^3$ is not hydrogen; and at least one multifunctional organoamine compound having the structure of Formula II:

$$NR^4R^5R^6 \quad (II),$$

wherein $R^4$, $R^5$ and $R^6$ are each independently selected from the group consisting of H, a $C_1$-$C_4$ alkylmonoamino group, a $C_1$-$C_4$ alkyldiamino group, and a $C_1$-$C_4$ alkyltriamino group, wherein at least one of $R^4$, $R^5$ and $R^6$ is not hydrogen. Either one or both of compounds of Formula I and Formula II are also referred to herein as "precursors."

Although the chemical reagents used herein (i.e., those of Formulae I and II) may be sometimes described as "gaseous," it is understood that the chemical reagents may be delivered directly as a gas to the reactor, delivered as a liquid to the reactor, delivered as vapors from vaporizing liquid or bubbling liquid using carrier gas such as nitrogen, helium or argon, vapors from subliming solid and/or transported by an inert carrier gas into the reactor.

In certain embodiments, any one or more of substituents $R^1$, $R^2$, and $R^3$ in the formulae described above can be linked with a C—C bond in the above formula to form a ring structure when they are not hydrogen. As the skilled person will understand, the substituent may be selected from a linear or branched $C_1$ to $C_{10}$ alkylene moiety; a $C_2$ to $C_{12}$ alkenylene moiety; a $C_2$ to $C_{12}$ alkynylene moiety; a $C_4$ to $C_{10}$ cyclic alkyl moiety; and a $C_6$ to $C_{10}$ arylene moiety. In these embodiments, the ring structure can be unsaturated such as, for example, a cyclic alkyl ring, or saturated, for example, an aryl ring. Further, in these embodiments, the ring structure can also be substituted or substituted. In other embodiments, any one or more of substituents $R^1$, $R^2$ and $R^3$ are not linked.

In preferred embodiments, the organosilicon compound of Formula I is at least one selected from the group consisting of Bis(tertiarybutylamino)silane, diisopropylaminosilane, tris-n-propylaminosilane, tetrakis-n-propylaminosilane, and tris-isopropylaminosilane.

Additional examples of the organosilicon compound of Formula I are the organoaminosilanes listed in Table 1 and the organoaminocarbosilane (more specifically organoamino-methylsilane) compounds of Table 2:

TABLE 1

Organoaminosilane Compounds

N-methyl-N-iso-propylaminosilane

N-sec-butyl-N-methylaminosilane

N-cyclohexyl-N-methylaminosilane

N-methyl-N-cyclopentylaminosilane

N-ethyl-N-iso-propylaminosilane

N-sec-butyl-N-ethylaminosilane

N-ethyl-N-cyclohexylaminosilane

N-ethyl-N-cyclopentylaminosilane

N-n-propyl-N-iso-propylaminosilane

N-sec-butyl-N-n-propylaminosilane

TABLE 1-continued

Organoaminosilane Compounds

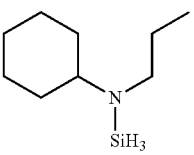
N-cyclohexyl-N-n-propylaminosilane

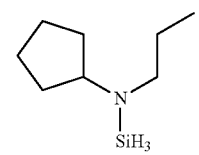
N-cyclopentyl-N-n-propylaminosilane

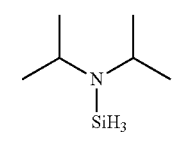
N,N-di-iso-propylaminosilane

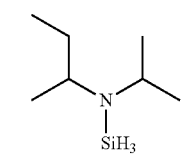
N-sec-butyl-N-iso-propylaminosilane

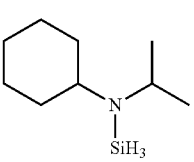
N-cyclohexyl-N-iso-propylaminosilane

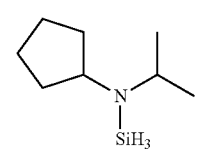
N-cyclopentyl-N-iso-propylaminosilane

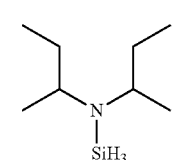
N,N-di-sec-butylaminosilane

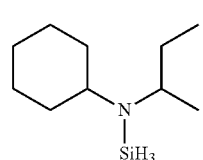
N-sec-butyl-N-cyclohexylaminosilane

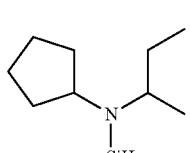
N-sec-butyl-N-cyclopentylaminosilane

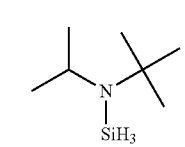
N-tertbutyl-N-iso-propylaminosilane

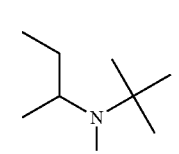
N-sec-butyl-N-tert-butylaminosilane

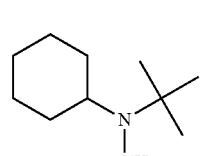
N-tert-butyl-N-cyclohexylaminosilane

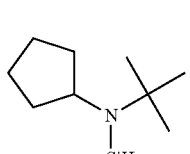
N-tert-butyl-N-cyclopentylaminosilane

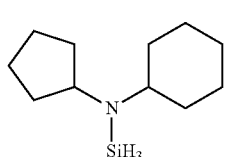
N,N-dicyclohexylaminosilane

TABLE 1-continued

Organoaminosilane Compounds

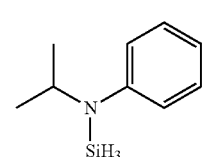
N-cyclohexyl-N-cyclopentylaminosilane

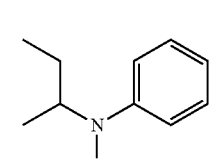
N-phenyl-N-iso-propylaminosilane

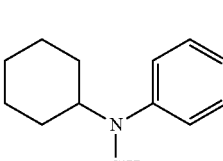
N-sec-butyl-N-phenylaminosilane

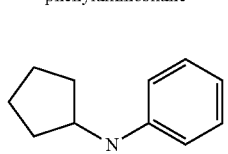
N-cyclohexyl-N-phenylaminosilane

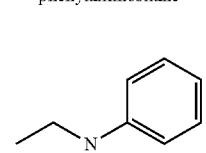
N-cyclopentyl-N-phenylaminosilane

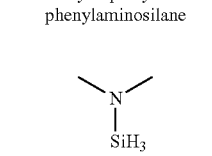
N-ethyl-N-phenylaminosilane

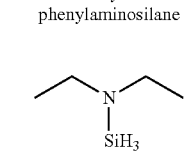
N,N-dimethylaminosilane

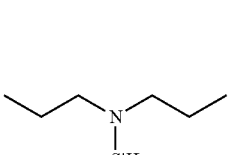
N,N-diethylaminosilane

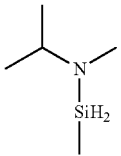
N,N-di-n-propylaminosilane

TABLE 2

Organoaminocarbosilane Compounds

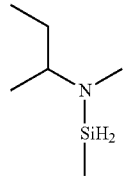
N-methyl-N-iso-propylamino-methylsilane

N-sec-butyl-N-methylamino-methylsilane

TABLE 2-continued

Organoaminocarbosilane Compounds

N-cyclohexyl-N-methylamino-methylsilane

N-methyl-N-cyclopentylamino-methylsilane

N-ethyl-N-iso-propylamino-methylsilane

N-sec-butyl-N-ethylamino-methylsilane

N-ethyl-N-cyclohexylamino-methylsilane

N-ethyl-N-cyclopentylamino-methylsilane

N-n-propyl-N-iso-propylamino-methylsilane

N-sec-butyl-N-n-propylamino-methylsilane

N-cyclohexyl-N-n-propylamino-methylsilane

N-cyclopentyl-N-n-propylamino-methylsilane

N,N-di-iso-propylamino-methylsilane

N-sec-butyl-N-iso-propylamino-methylsilane

N-cyclohexyl-N-iso-propylamino-methylsilane

N-cyclopentyl-N-iso-propylamino-methylsilane

N,N-di-sec-butylamino-methylsilane

N-sec-butyl-N-cyclohexylamino-methylsilane

N-sec-butyl-N-cyclopentylamino-methylsilane

N-tert-butyl-N-iso-propylamino-methylsilane

N-sec-butyl-N-tert-butylamino-methylsilane

N-tert-butyl-N-cyclohexylamino-methylsilane

N-tert-butyl-N-cyclopentylamino-methylsilane

N,N-dicyclohexylamino-methylsilane

TABLE 2-continued

Organoaminocarbosilane Compounds

N-cyclohexyl-N-cyclopentylamino-methylsilane

N-phenyl-N-iso-propylamino-methylsilane

N-sec-butyl-N-phenylamino-methylsilane

N-cyclohexyl-N-phenylamino-methylsilane

N-cyclopentyl-N-phenylamino-methylsilane

N-ethyl-N-phenylamino-methylsilane

N,N-dimethylamino-methylsilane

N,N-diethylamino-methylsilane

N,N-di-n-propylamino-methylsilane

The multifunctional amine compound is a compound represented by Formula II, $NR^4R^5R^6$ wherein $R^4$, $R^5$ and $R^6$ are each independently selected from the group consisting of H, alkylmonoamino group, an alkyldiamino group, and an alkyltriamino group. With reference to the preceeding amine compound of Formula II, suitable alkyl groups for the alkyl portion of the alkylmonoamino, alkyldiamino, and alkyltriamino groups include straight or branched chain $C_1$-$C_4$ alkyl groups. The amino portion of the alkylmonoamino, alkyldiamino, and alkyltriamino groups include primary, secondary and tertiary amines as well as higher alkyl amino functionality such as di- and tri-amines. Examples of such multifunctional organoamines of Formula II include, for example, N,N-bis(2-aminoethyl)-1,2-ethanediamine N-(2-aminoethyl)-1,2-ethanediamine $N^1,N^2$-bis(2-aminoethyl)-1,2-ethanediamine 1,2-diaminopropane   2,3-diaminobutane   ethylenediamine 1,2-cyclohexanediamine   1,3-cyclohexanediamine 1,4-cyclohexanediamine   1,2-benzenediamine 1,3-benzenediamine   , and   1,4-benzenediamine Other exemplary multifunctional organoamine compounds having the structure of Formula II include, for example, ethylenediamine, 1,2-diaminopropane, 1,3-diaminopropane, 2,3-diaminobutane, and butane-1,4-diamine. In preferred embodiments, ethylenediamine is the multifunctional organoamine of Formula II.

The precursor compounds described herein may be delivered to the reaction chamber such as a CVD or ALD reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, Minn., to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

The silicon-containing precursor compounds of Formula I are preferably substantially free of halide ions such as chloride or metal ions such as Al. As used herein, the term "substantially free" as it relates to halide ions (or halides) such as, for example, chlorides and fluorides, bromides, iodides, $Al^{3+}$ ions, $Fe^{2+}$, $Fe^{3+}$, $Ni^{2+}$, $Cr^{3+}$ means less than 5 ppm (by weight), preferably less than 3 ppm, and more preferably less than 1 ppm, and most preferably 0 ppm. Chlorides or metal ions are known to act as decomposition catalysts for silicon precursors. Significant levels of chloride in the final product can cause the silicon precursors to degrade. The gradual degradation of the silicon precursors may directly impact the film deposition process making it difficult for the semiconductor manufacturer to meet film specifications. In addition, the shelf-life or stability is negatively impacted by the higher degradation rate of the silicon precursors thereby making it difficult to guarantee a 1-2 year shelf-life. Moreover, silicon precursors are known to form flammable and/or pyrophoric gases upon decomposition such as hydrogen and silane. Therefore, the accelerated decomposition of the silicon-containing precursors presents safety and performance concerns related to the formation of these flammable and/or pyrophoric gaseous byproducts.

Silicon-containing precursors according to the present invention that are substantially free of halides can be achieved by (1) reducing or eliminating chloride sources during chemical synthesis, and/or (2) implementing an effective purification process to remove chloride from the crude product such that the final purified product is substantially free of chlorides. Chloride sources may be reduced during synthesis by using reagents that do not contain halides such as chlorodisilanes, bromodisilanes, or iododisilanes thereby avoiding the production of by-products that contain halide ions. In addition, the aforementioned reagents should be substantially free of chloride impurities such that the resulting crude product is substantially free of chloride impurities. In a similar manner, the synthesis should not use halide based solvents, catalysts, or solvents which contain unacceptably high levels of halide contamination. The crude product may also be treated by various purification methods to render the final product substantially free of halides such as chlorides. Such methods are well described in the prior art and, may include, but are not limited to purification processes such as distillation, or adsorption. Distillation is commonly used to separate impurities from the desire product by exploiting differences in boiling point. Adsorption may also be used to take advantage of the differential adsorptive properties of the components to effect separation such that the final product is substantially free of halide. Adsorbents such as, for example, commercially available $MgO$—$Al_2O_3$ blends can be used to remove halides such as chloride.

For those embodiments relating to a composition comprising a solvent(s) and at least one silicon-containing compound described herein, the solvent or mixture thereof selected does not react with the silicon compound. The amount of solvent by weight percentage in the composition ranges from 0.5% by weight to 99.5% or from 10% by weight to 75%. In this or other embodiments, the solvent has a boiling point (b.p.) similar to the b.p. of the precursors of Formulae I and II or the difference between the b.p. of the solvent and the b.p. of the silicon precursor precursors of Formulae I and II is 40° C. or less, 30° C. or less, or 20° C. or less, 10° C. or less, or 5° C. or less. Alternatively, the difference between the boiling points ranges from any one or more of the following end-points: 0, 10, 20, 30, or 40° C. Examples of suitable ranges of b.p. difference include without limitation, 0° C. to 40° C., 20° C. to 30° C., or 10° C. to 30° C. Examples of suitable solvents in the compositions include, but are not limited to, an ether (such as 1,4-dioxane, dibutyl ether), a tertiary amine (such as pyridine, 1-methylpiperidine, 1-ethylpiperidine, N,N'-Dimethylpiperazine, N,N,N',N'-Tetramethylethylenediamine), a nitrile (such as benzonitrile), an alkyl hydrocarbon (such as octane, nonane, dodecane, ethylcyclohexane), an aromatic hydrocarbon (such as toluene, mesitylene), a tertiary aminoether (such as bis(2-dimethylaminoethyl) ether), or mixtures thereof.

In one particular embodiment, the introducing step, wherein the compounds of Formula I and Formula II are introduced into the reactor, the substrate temperature of the reactor is selected as noted above. In these or other embodiments, the substrate comprises a semiconductor substrate comprising a surface feature wherein in some embodiments the goal is to permanently and completely fill in the surface feature with the flowable reactant product.

The method of the present development includes the step of at least partially reacting the compounds of Formula I and Formula II optionally in the presence of an energy source to form a flowable liquid oligomer wherein the flowable liquid oligomer forms a coating on the substrate and at least partially fills at least a portion of the at least one surface feature. The energy source, when employed, may induce reaction and to form the silicon-containing film or coating on the substrate. Such energy can be provided by, but not limited to, one or more of thermal (i.e., heat), plasma, pulsed plasma, helicon plasma, high density plasma, inductively coupled plasma, X-ray, e-beam, photon, remote plasma methods, and combinations thereof. In certain embodiments where a plasma is employed, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

In one particular embodiment where heat is employed as the energy source, the amount of heat is preferably sufficient to achieve a temperature of from about −20° C. to about 200° C. More specifically, from temperature ranges of −20° C. to 20° C., from 20° C. to 60° C., and from 60° C. to 100° C.

In some embodiments, an energy source is not employed and reaction occurs at ambient (i.e., room) temperature.

In one particular embodiment where a plasma is employed, the plasma is selected from but not limited to the group consisting of a nitrogen plasma; plasma comprising nitrogen and helium; a plasma comprising nitrogen and argon; an ammonia plasma; a plasma comprising ammonia and helium; a plasma comprising ammonia and argon; helium plasma; argon plasma; hydrogen plasma; a plasma comprising hydrogen and helium; a plasma comprising hydrogen and argon; a plasma comprising ammonia and hydrogen; an organic amine plasma; a plasma comprising oxygen; a plasma comprising oxygen and hydrogen, and mixtures thereof.

In another embodiment, the plasma source is selected from but not limited to the group consisting of a carbon source plasma, including a hydrocarbon plasma, a plasma comprising hydrocarbon and helium, a plasma comprising hydrocarbon and argon, carbon dioxide plasma, carbon monoxide plasma, a plasma comprising hydrocarbon and hydrogen, a plasma comprising hydrocarbon and a nitrogen source, a plasma comprising hydrocarbon and an oxygen source, and mixture thereof.

In some embodiments, plasma energy is employed after heat energy.

As previously mentioned, the method deposits a film upon at least a portion of the surface of a substrate comprising a surface feature. The substrate is placed into the reactor and the substrate is maintained at one or more temperatures ranging from about −20° C. to about 400° C. In one particular embodiment, the temperature of the substrate is less than the walls of the chamber. The substrate temperature is held at a temperature below 100° C., preferably at a temperature below 25° C. and most preferably below 10° C. and greater than −20° C.

In certain embodiments, the reactor is at a pressure below atmospheric pressure or 750 torr ($10^5$ Pascals (Pa)) or less, or 100 torr (13332 Pa) or less. In other embodiments, the pressure of the reactor is maintained at a range of about 0.1 torr (13 Pa) to about 10 torr (1333 Pa).

In the presence of energy, in some embodiments the silicon-containing compounds of Formula I and Formula II react with each other and form oligomers which condense as a liquid (liquid oligomers) on the surface of the substrate and at least partially fill the features on the substrate. However, direct use of the as-deposited film can result in a dielectric that is too porous and does not have an adequate mechanical strength. Thus, certain embodiments of the present development are applied to perform further treatment of the as-deposited silicon oxide layer to improve film quality with increased density and still achieve a void free gap fill.

In preferred embodiments, the flowable liquid oligomer is thermally annealed at one or more temperatures ranging from about 100° C. to about 1000° C. to densify at least a portion of the materials followed by broadband UV treatment at the temperature ranging from 100° C. to 1000° C.

Film densities typically range from 1.8 to 2.8 $g/cm^3$ for silicon nitride or carbon doped silicon nitride. Thus, such films are suitable for use as low-k material applications. The dielectric consantant, k, achieved typically ranges from 2.5 to 2.8, or 2.5 to 3.9, for carbon doped silicon oxide.

In certain embodiments, the resultant silicon-containing films or coatings can be exposed to a post-deposition treatment such as, but not limited to, a plasma treatment including, but not limited to, hydrogen plasma, helium plasm, argon plasma, ammonia plasma, water ($H_2O$) plasma, oxygen plasma, ozone ($O_3$) plasma, NO plasma, $N_2O$ plasma, carbon monoxide (CO) plasma, carbon dioxide ($CO_2$) plasma and combinations thereof, chemical treatment, ultraviolet light exposure, Infrared exposure, electron beam exposure, and/or other treatments to affect one or more properties of the film.

In some embodiments, the post thermal treatment materials are exposed to a plasma, infrared lights, chemical treatment, an electron beam, or UV light to form a dense film.

The above steps define one cycle for the methods described herein; and the cycle can be repeated until the desired thickness of a silicon-containing film is obtained. In this or other embodiments, it is understood that the steps of the methods described herein may be performed in a variety of orders, may be performed sequentially or concurrently (e.g., during at least a portion of another step), and any combination thereof. The respective step of supplying the compounds and other reagents may be performed by varying the duration of the time for supplying them to change the stoichiometric composition of the resulting silicon-containing film.

The following examples are provided for the purpose of further illustrating the present invention but are by no means intended to limit the same.

EXAMPLES

Flowable chemical vapor deposition (FCVD) films were deposited onto medium resistivity (8-12 Ωcm) single crystal silicon wafer substrates and Si pattern wafers. In certain examples, the resultant silicon-containing films or coatings can be exposed to a post-deposition treatment such as, but not limited to, a plasma treatment, thermal treatment, chemical treatment, ultraviolet light exposure, Infrared exposure, electron beam exposure, and/or other treatments to affect one or more properties of the film. Depositions on a modified FCVD chamber on an Applied Materials Precision 5000 system, can be performed using either a silane or a TEOS process kit. The chamber has direct liquid injection (DLI) delivery capability. The precursors are liquids with delivery temperatures dependent on the precursor's boiling point.

To deposit initial flowable nitride films, typical liquid precursor flow rates were 100-5000 mg/min, in-situ plasma power density was 0.25-3.5 $W/cm^2$, pressure was 0.75-12 Torr. To densify the as-deposit flowable films, the films were thermally annealed and/or UV cured in vacuum using the modified PECVD chamber at 100~1000 C, preferably 300~400° C. Thickness and refractive index (RI) at 632 nm were measured by a SCI reflectometer or Woollam ellipsometer. Typical film thickness ranged from 10 to 2000 nm. Bonding properties and hydrogen content (Si—H, C—H and N—H) of the silicon-based films were measured and analyzed by a Nicolet transmission Fourier transform infrared spectroscopy (FTIR) tool. All density measurements were accomplished using X-ray reflectivity (XRR). X-ray Photoelectron Spectroscopy (XPS) and Secondary ion mass spectrometry (SIMS) analysis were performed to determine the elemental composition of the films. The flowability and gap fill effects on patterned wafers were observed by a cross-sectional Scanning Electron Microscopy (SEM) using a Hitachi S-4800 system at a resolution of 2.0 nm. The porosity of the film was measured by ellipsometric porosimetry.

Flowable CVD depositions were conducted using a design of experiment (DOE) methodology. The experimental design includes: precursor flows from 100 to 5000 mg/min, preferably 500 to 2000 mg/min; oxygen (or $CO_2$) flow from 0 sccm to 1000 sccm, preferably 0 to 100 sccm; pressure from 0.75 to 12 Torr, preferably 6 to 10 Torr; RF power (13.56 MHz) 50 to 1000 W, preferably 100~500 W; Low-frequency (LF) power 0 to 100 W; and deposition temperature ranged from −20 to 400° C., preferably −20° C. to 40° C. The DOE experiments were used to determine what process parameters produced the optimal film with good flowability.

Deposition of Low-K Film with BTBAS (Secondary Silane) and EDA

To 2.0 g (11.47 mmol) of BTBAS (bis-tert-butylaminosilane) was added 0.34 g (5.74 mmol) of ethylene diamine (EDA) (dried over molsieves). Bubbling was observed upon addition and after 16 hours, TGA/DSC analysis indicated polymerization had taken place due to high residual mass. Volatiles were removed by heating under vacuum and a white solid was isolated. The solid was analyzed by FTIR using a KBr pellet and showed Si—H, CHx, as well as some residual N—H. Elemental analysis (EA) for the solid was 27.80% carbon, 9.39% hydrogen, 27.01% nitrogen, and 35.80% silicon, assuming the rest to be silicon, compared to the theoretical SiCNH$_2$ network calculated to be 21.40% carbon, 3.59% hydrogen, 24.96% nitrogen, and 50.05% silicon.

In another experiment, to 1.5 g (8.60 mmol) of BTBAS (bis-tert-butylaminosilane) was added 0.25 g (4.16 mmol) of ethylene diamine (EDA) (dried over molsieves). The mixture was allowed to react for 10 minutes after which it was deposited on a patterned wafer and allowed to sit for 5 minutes. The wafer was then inverted to allow excess reaction mixture drip off, and the wafer was annealed on a hot plate at >150° C. for 5 minutes. SEM images of a cross-sectional view showed no deposited material in the wafer trenches (not shown).

Deposition of Low-K Film with DIPAS (Primary Silane) and EDA

To 2.0 g (15.23 mmol) of DIPAS (diisopropylaminosilane) was added 0.46 g (7.62 mmol) of ethylene diamine (EDA) (dried over molsieves). Bubbling was observed upon addition and after 16 hours, TGA/DSC analysis indicated polymerization had taken place due to high residual mass. Volatiles were removed by heating under vacuum and a white solid was isolated. The solid was analyzed by FTIR using a KBr pellet and showed Si—H, CHx, as well as some residual N—H. EA for the solid was 20.51% carbon, 7.77% hydrogen, 21.21% nitrogen, and 50.51% silicon, assuming the rest to be silicon, compared to the theoretical SiCNH2 network calculated to be 21.40% carbon, 3.59% hydrogen, 24.96% nitrogen, and 50.05% silicon.

Figure 2:
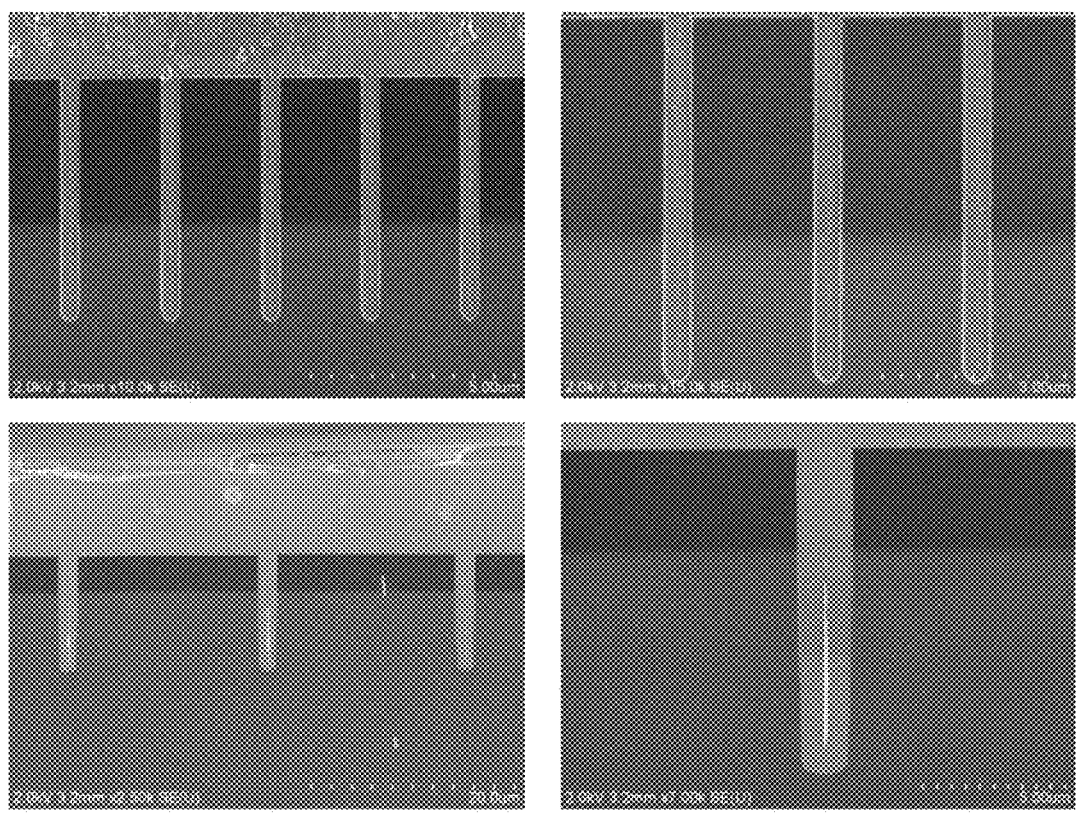
FIG. 2 shows the SEM images of a cross-sectional view of the deposited material in 10:1 and 5:1 aspect ratio wafer trenches.

In another experiment, to 1.0 g (7.62 mmol) of DIPAS (diisopropylaminosilane) was added 0.25 g (4.16 mmol) of ethylene diamine (EDA) (dried over molecular sieves). The mixture was allowed to react for 10 minutes after which it was deposited on a patterned wafer and allowed to sit for 5 minutes. The wafer was then inverted to allow excess reaction mixture to drip off, and the wafer was annealed on a hot plate at >150° C. for 5 minutes. The resulting film was tacky yet hard. FIG. 2 shows the SEM images of a cross-sectional view of the deposited material in 10:1 and 5:1 aspect ratio wafer trenches.

Deposition of Low-K Film with SN-426 (Quaternary Silane) and EDA

To 4.0 g (15.36 mmol) of tetrakis-n-propylaminosilane (SN-426) was added 0.92 g (15.36 mmol) of ethylene diamine (EDA) (dried over molsieves). Volatiles were removed by distillation by heating at >130° C. at atmospheric pressure and a white solid was isolated. TGA/DSC of the solid showed it to be approximately 50% volatile with a 50% residual mass. The solid was analyzed by FTIR using a KBr pellet and showed CHx, as well as some residual N—H.

In another experiment, to 0.32 g (1.23 mmol) of SN-426 (tertakis-n-propylaminosilane) was added 0.08 g (1.33 mmol) of ethylene diamine (EDA) (dried over molsieves). The mixture was allowed to react for 10 minutes after which it was deposited on a patterned wafer and allowed to sit for 5 minutes. The wafer was then inverted to allow excess reaction mixture drip off, and the wafer was annealed on a hot plate at >150° C. for 5 minutes. SEM images of a cross-sectional view showed no deposited material in the wafer trenches (not shown).

Deposition of Low-K Film with SN-167 (Tertiary Silane) and EDA

To 2.0 g (9.84 mmol) of tris-isopropylaminosilane (SN-167) was added 1.78 g (29.5 mmol) of ethylene diamine (EDA) (dried over molsieves). The mixture was refluxed for 4.5 hours then volatiles were removed by heating at >60° C. under vacuum and a white solid was isolated in the amount of 0.23 g. TGA/DSC of the solid showed it to be involatile with a 98% residual mass. The solid was analyzed by FTIR using a KBr pellet and showed Si—H and CHx.

Figure 3:
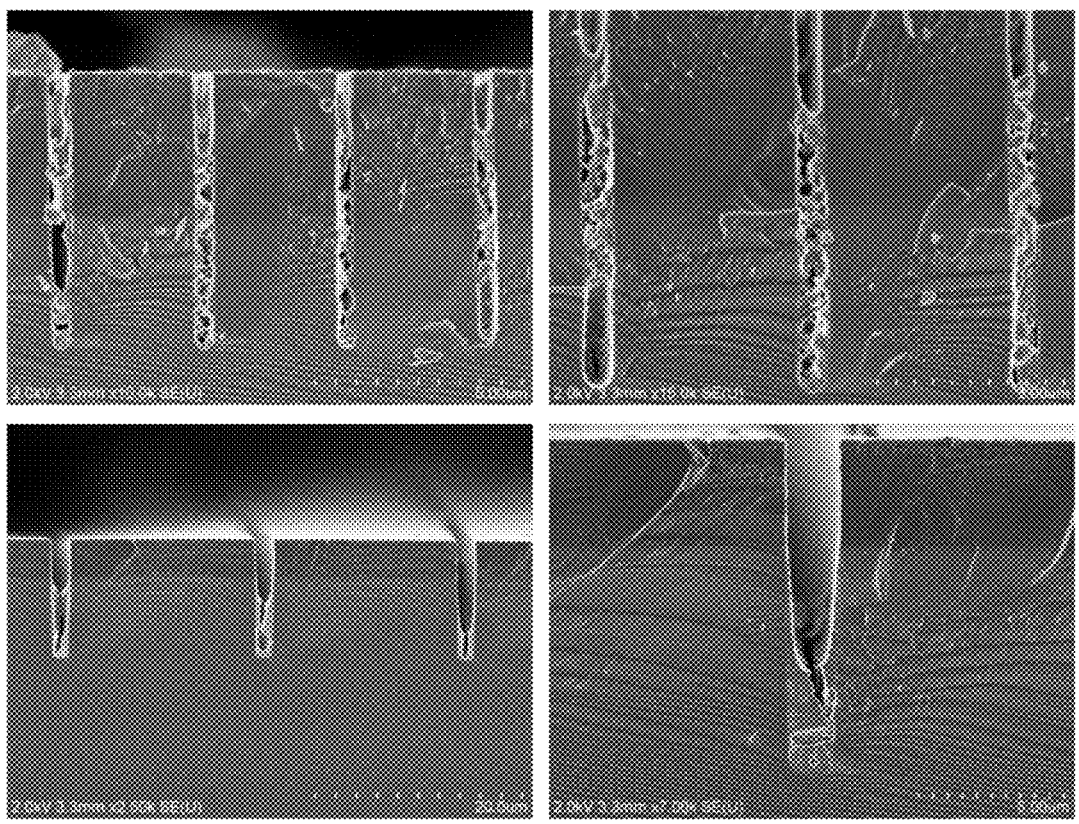
FIG. 3 shows the SEM images of a cross-sectional view of the deposited material in 10:1 and 5:1 aspect ratio wafer trenches with many voids.

In another experiment, to 1.06 g (5.21 mmol) of SN-167 (tris-isopropylaminosilane) was added 1.08 g (17.97 mmol) of ethylene diamine (EDA) (dried over molsieves). The mixture was allowed to react for 10 minutes after which it was deposited on a patterned wafer and allowed to sit for 5 minutes. The wafer was then inverted to allow excess reaction mixture to drip off, and the wafer was annealed on a hot plate at >150° C. for 5 minutes. FIG. 3 shows the SEM images of a cross-sectional view of the deposited material in 10:1 and 5:1 aspect ratio wafer trenches with many voids.

While the principles of the invention have been described above in connection with preferred embodiments, it is to be clearly understood that this description is made only by way of example and not as a limitation of the scope of the invention.

The invention claimed is:

1. A method for depositing a silicon-containing film, comprising:

placing a substrate comprising at least one surface feature into a reactor;

adjusting the reactor to a first pressure;

introducing at least one organoaminosilane compound and at least one multifunctional organoamine compound into the reactor:

wherein the at least one organoaminosilane compound has the structure according to Formula I:

$$(R^1R^2N)_{4-n}Si—R^3{}_n \qquad (I),$$

wherein $R^1$, $R^2$ and $R^3$ are selected from the group consisting of hydrogen, $C_1$ to $C_{10}$ linear or branched alkyl, cyclic alkyl, alkenyl, alkynyl, and aryl;

wherein n=0, 1, 2, 3;

wherein at least one of $R^1$, $R^2$ and $R^3$ is not hydrogen;

wherein the at least one multifunctional organoamine compound has the structure according to Formula II:

$$NR^4R^5R^6 \qquad (II),$$

wherein $R^4$, $R^5$ and $R^6$ are each independently selected from the group consisting of H, a $C_1$-$C_4$ alkylmonoamino group, a $C_1$-$C_4$ alkyldiamino group, and a $C_1$-$C_4$ alkyltriamino group; and wherein at least one of $R^4$, $R^5$ and $R^6$ is not hydrogen;

permitting the at least one organoaminosilane compound, and the at least one multifunctional organoamine compound, to react and form an oligomer that condenses on the substrate because its vapor pressure is less than the first pressure to form a flowable liquid oligomer;

wherein the flowable liquid oligomer forms a coating on the substrate and at least partially fills at least a portion of the at least one surface feature;

wherein the at least one multifunctional organoamine compound is ethylenediamine and at least one additional multifunctional organoamine compound selected from the group consisting of

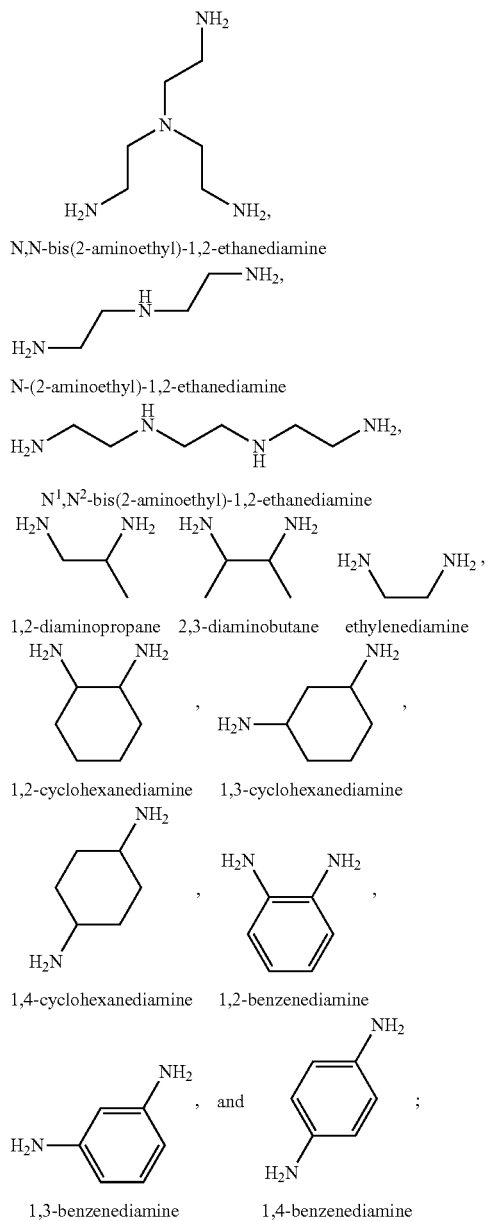

and
wherein the at least one organoaminosilane compound is tetrakis-n-propylaminosilane.

2. The method of claim 1 wherein the permitting steps further include an energy source being present.

3. The method of claim 2 wherein the energy source is heat.

4. The method of claim 2 wherein the energy source is plasma.

5. The method of claim 4 wherein the plasma is selected from the group consisting of a nitrogen plasma, a plasma comprising nitrogen and helium, a plasma comprising nitrogen and argon, an ammonia plasma, a plasma comprising ammonia and helium, a plasma comprising ammonia and argon, helium plasma, argon plasma, hydrogen plasma, a plasma comprising hydrogen and helium, a plasma comprising hydrogen and argon, a plasma comprising ammonia and hydrogen, an organic amine plasma, a plasma comprising oxygen, a plasma comprising oxygen and hydrogen, and mixtures thereof.

6. The method of claim 4 wherein the plasma is selected from the group consisting of a carbon plasma or a hydrocarbon plasma, a plasma comprising hydrocarbon and helium, a plasma comprising hydrocarbon and argon, a carbon dioxide plasma, a carbon monoxide plasma, a plasma comprising a hydrocarbon and hydrogen, a plasma comprising a hydrocarbon and nitrogen, a plasma comprising hydrocarbon and oxygen, and mixture thereof.

7. The method of claim 2 further comprising exposing the at least one organoaminosilane compound and the multifunctional organoamine compound to a plasma energy source.

8. The method of claim 1 further comprising the step of subjecting the coating to a thermal treatment at one or more temperatures between about 100° C. to about 1000° C. to densify at least a portion of the coating and form a hardened layer.

9. The method of claim 8 further comprising the step of exposing the hardened layer to energy selected from the group consisting of a plasma, infrared light, chemical treatment, an electron beam, or UV light to form the final silicon-containing film.

10. The method of claim 9 wherein the above steps define one cycle for the method and the cycle can be repeated until the desired thickness of the silicon-containing film is obtained.

11. The method of claim 1 wherein the silicon-containing film is selected from the group consisting of a silicon nitride, a silicon carbide, and a carbon-doped silicon nitride.

12. The method of claim 1 wherein the at least one surface feature is selected from the group consisting of pores, trenches, shallow trench isolation (STI), vias, and reentrant features.

13. The method of claim 12 wherein the at least one surface feature has a width of 100 μm or less.

14. The method of claim 13 wherein the at least one surface feature has a width of 1 μm or less.

15. The method of claim 14 wherein the at least one surface feature has a width of 0.5 μm or less.

16. The method of claim 15 wherein the at least one surface feature has a width of 50 nm or less.

17. The method of claim 12 wherein the at least one surface feature has an aspect ratio of 0.1:1 or greater.

18. The method of claim 17 wherein the at least one surface feature has an aspect ratio of 1:1 or greater.

19. The method of claim 18 wherein the at least one surface feature has an aspect ratio of 10:1 or greater.

20. The method of claim 19 wherein the at least one surface feature has an aspect ratio of 20:1 or greater.

21. The method of claim 20 wherein the at least one surface feature has an aspect ratio of 40:1 or greater.

22. The method of claim 1 further comprising the step of thermally annealing the flowable liquid oligomer at one or more temperatures ranging from about 100° C. to about 1000° C. to densify at least a portion of the materials, followed by broadband UV treatment at the temperature ranging from 100° C. to 1000° C.

23. The method of claim 1 wherein the resultant silicon-containing film is exposed to a post-deposition treatment selected from the group consisting of hydrogen plasma, helium plasm, argon plasma, ammonia plasma, water (H₂O) plasma, oxygen plasma, ozone (O₃) plasma, NO plasma, N₂O plasma, carbon monoxide (CO) plasma, carbon dioxide (CO₂) plasma and combinations thereof, chemical treatment, ultraviolet light exposure, Infrared exposure, and electron beam exposure.

24. A method for depositing a silicon-containing film, comprising:
placing a substrate comprising at least one surface feature into a reactor;
adjusting the reactor to a first pressure;
introducing at least one organoaminosilane compound and at least one multifunctional organoamine compound into the reactor:
wherein the at least one organoaminosilane compound has the structure according to Formula I:

(R¹R²N)₄₋ₙSi—R³ₙ     (I), wherein R¹, R² and R³ are selected from the group consisting of hydrogen, C₁ to C₁₀ linear or branched alkyl, cyclic alkyl, alkenyl, alkynyl, and aryl;
wherein n=0, 1, 2, 3;
wherein at least one of R¹, R² and R³ is not hydrogen;
wherein the at least one multifunctional organoamine compound has the structure according to Formula II:

NR⁴R⁵R⁶     (II), wherein R⁴, R⁵ and R⁶ are each independently selected from the group consisting of H, a C₁-C₄ alkylmonoamino group, a C₁-C₄ alkyldiamino group, and a C₁-C₄ alkyltriamino group; and
wherein at least one of R⁴, R⁵ and R⁶ is not hydrogen;
permitting the at least one organoaminosilane compound, and the at least one multifunctional organoamine compound, to react and form an oligomer that condenses on the substrate because its vapor pressure is less than the first pressure to form a flowable liquid oligomer;
wherein the flowable liquid oligomer forms a coating on the substrate and at least partially fills at least a portion of the at least one surface feature;
wherein the at least one multifunctional organoamine compound is ethylenediamine and at least one additional multifunctional organoamine compound selected from the group consisting of

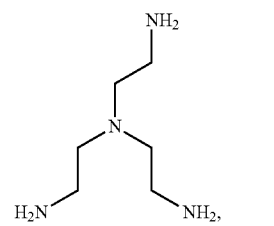

N,N-bis(2-aminoethyl)-1,2-ethanediamine

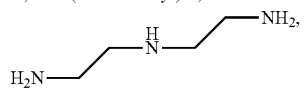

N-(2-aminoethyl)-1,2-ethanediamine

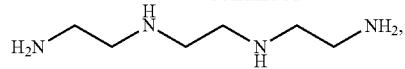

N¹,N²-bis(2-aminoethyl)-1,2-ethanediamine

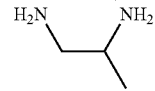

1,2-diaminopropane

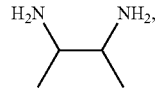

2,3-diaminobutane

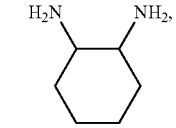

1,2-cyclohexanediamine

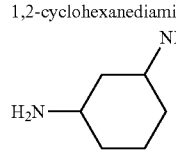

1,3-cyclohexanediamine

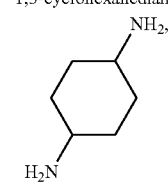

1,4-cyclohexanediamine

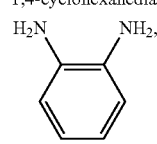

1,2-benzenediamine

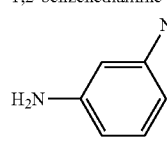

1,3-benzenediamine

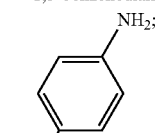

1,4-benzenediamine and
wherein the at least one organoaminosilane compound is tris-isopropylaminosilane.

* * * * *